United States Patent
Bostick et al.

(10) Patent No.: US 10,591,880 B2
(45) Date of Patent: *Mar. 17, 2020

(54) METHOD FOR REPAIRING WITH 3D PRINTING

(71) Applicant: INTERNATIONAL BUSINESS MACHINES CORPORATION, Armonk, NY (US)

(72) Inventors: James E. Bostick, Cedar Park, TX (US); John M. Ganci, Jr., Cary, NC (US); Martin G. Keen, Cary, NC (US); Sarbajit K. Rakshit, Kolkata (IN); Kimberly G. Starks, Nashville, TN (US); Craig M. Trim, Sylmar, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 162 days.

This patent is subject to a terminal disclaimer.

(21) Appl. No.: 15/825,692

(22) Filed: Nov. 29, 2017

(65) Prior Publication Data

US 2018/0081334 A1 Mar. 22, 2018

Related U.S. Application Data

(63) Continuation of application No. 14/539,525, filed on Nov. 12, 2014, now Pat. No. 9,857,784.

(51) Int. Cl.
  *G06F 19/00* (2018.01)
  *G05B 15/02* (2006.01)
  (Continued)

(52) U.S. Cl.
  CPC .............. *G05B 15/02* (2013.01); *B33Y 50/00* (2014.12); *G06F 17/50* (2013.01)

(58) Field of Classification Search
  CPC .......... G05B 15/02; B33Y 50/00; G06F 17/50
  See application file for complete search history.

(56) References Cited

U.S. PATENT DOCUMENTS

| | | | | |
|---|---|---|---|---|
| 4,918,627 A | * | 4/1990 | Garcia | .................... G06T 7/001 348/92 |
| 7,006,084 B1 | * | 2/2006 | Buss | .................... G05B 19/408 345/419 |

(Continued)

FOREIGN PATENT DOCUMENTS

| | | |
|---|---|---|
| WO | 2011042899 A1 | 4/2011 |
| WO | 2013113372 A1 | 8/2013 |

OTHER PUBLICATIONS

Mueller, Stefanie, et al. "faBrickation: fast 3D printing of functional objects by integrating construction kit building blocks." Proceedings of the SIGCHI Conference on Human Factors in Computing Systems. ACM. (Year: 2014).*

(Continued)

*Primary Examiner* — Adam Lee
(74) *Attorney, Agent, or Firm* — Jay Wahlquist; Andrew M. Calderon; Roberts Mlotkowski Safran Cole & Calderon, P.C.

(57) ABSTRACT

Methods and apparatuses for repairing a broken object. A processor retrieves information describing the size and shape of a broken object. A processor retrieves information describing the size and shape of an intact object, wherein the intact object includes a part missing from the broken object. A processor generates a first three-dimensional model of the broken object based, at least in part, on the information describing the size and shape of the broken object. A processor generates a second three-dimensional model of the intact object based, at least in part, on the information describing the size and shape of the intact object. A processor generates a third three-dimensional model based, at least (Continued)

in part, on a difference between the first and second three-dimensional model. A processor sends one or more instructions to a three-dimensional printer to create an object based, at least in part, on the third three-dimensional model.

20 Claims, 3 Drawing Sheets

(51) Int. Cl.
  *G06F 17/50* (2006.01)
  *B33Y 50/00* (2015.01)

(56) References Cited

U.S. PATENT DOCUMENTS

| | | | |
|---|---|---|---|
| 7,653,263 B2 | 1/2010 | Wheeler et al. | |
| 2002/0004710 A1* | 1/2002 | Murao | G06T 17/005 702/167 |
| 2003/0074174 A1 | 4/2003 | Fu et al. | |
| 2003/0143268 A1* | 7/2003 | Pryce Lewis | A61J 3/10 424/464 |
| 2004/0067465 A1 | 4/2004 | Schomann | |
| 2004/0157527 A1 | 8/2004 | Omar | |
| 2008/0078396 A1 | 4/2008 | Janbakhsh | |
| 2009/0322860 A1 | 12/2009 | Zhang et al. | |
| 2013/0287294 A1 | 10/2013 | Ye et al. | |
| 2014/0025181 A1* | 1/2014 | Vanasse | A61F 2/28 623/23.55 |
| 2014/0058959 A1 | 2/2014 | Isbjornssund et al. | |
| 2014/0117575 A1* | 5/2014 | Kemperle | B29C 47/92 264/40.7 |
| 2014/0134335 A1* | 5/2014 | Pridoehl | B29C 64/106 427/256 |
| 2014/0309766 A1 | 10/2014 | Kunimitsu et al. | |
| 2015/0009214 A1 | 1/2015 | Lee et al. | |
| 2015/0042678 A1 | 2/2015 | Alt et al. | |
| 2015/0120033 A1 | 4/2015 | Hotta et al. | |
| 2015/0140517 A1* | 5/2015 | Vuillemot | A61C 13/0019 433/226 |
| 2015/0174821 A1* | 6/2015 | Levine | B33Y 10/00 264/401 |
| 2015/0301517 A1 | 10/2015 | Chen et al. | |
| 2016/0048609 A1 | 2/2016 | Voris et al. | |
| 2016/0059489 A1 | 3/2016 | Wang et al. | |
| 2016/0129638 A1 | 5/2016 | Bostick et al. | |
| 2017/0225400 A1 | 8/2017 | Lee et al. | |

OTHER PUBLICATIONS

Nguyen, "How 30 Printing Helped Repair This Man's Face", pp. 1-5, Apr. 2, 2014, <http://www.smithsonianmag.com/innovation/how-3d-printing-technology-helped-repair-mans-face-180950320/#Rs7FSTx6hUzzAAYq.99>, accessed May 15, 2014.

"30 printing", From Wikipedia, the free encyclopedia, This page was last modified on May 20, 2014 at 15:57, pp. 1-31, <http://en.wikipedia.org/wiki/30_printing>.

"List of IBM Patents or Patent Applications Treated as Related" 1 page.

* cited by examiner

METHOD FOR REPAIRING WITH 3D PRINTING

BACKGROUND OF THE INVENTION

The present invention relates generally to the field of three-dimensional printing, and more particularly to corrective maintenance.

Three-dimensional (3D) printing or additive manufacturing is a process of making a three-dimensional object of any shape from a digital model. 3D printing is achieved using an additive process, where successive layers of material are laid down in different shapes. 3D printing is also considered distinct from traditional machining techniques, which mostly rely on the removal of material by methods such as cutting or drilling (subtractive processes). Once a three-dimensional model is created, the 3D printer can create copies of the digital object. 3D printers offer low cost and quick turnover from design to production when compared to other forms of manufacturing, such as molding or milling. Such low barriers of entry have increased the variety of objects being manufactured in addition to those who would produce the objects.

SUMMARY

Embodiments of the present invention provide a method, system, and program product to repair a broken object. A processor retrieves information describing the size and shape of a broken object. A processor retrieves information describing the size and shape of an intact object, wherein the intact object includes a part missing from the broken object. A processor generates a first three-dimensional model of the broken object, based at least in part, on the information describing the size and shape of the broken object. A processor generates a second three-dimensional model of the intact object, based at least in part, on the information describing the size and shape of the intact object. A processor generates a third three-dimensional model, based at least in part, on a difference between the first and second three-dimensional model. A processor sends one or more instructions to a three-dimensional printer to create an object, based at least in part, on the third three-dimensional model.

DETAILED DESCRIPTION

Figure 1:
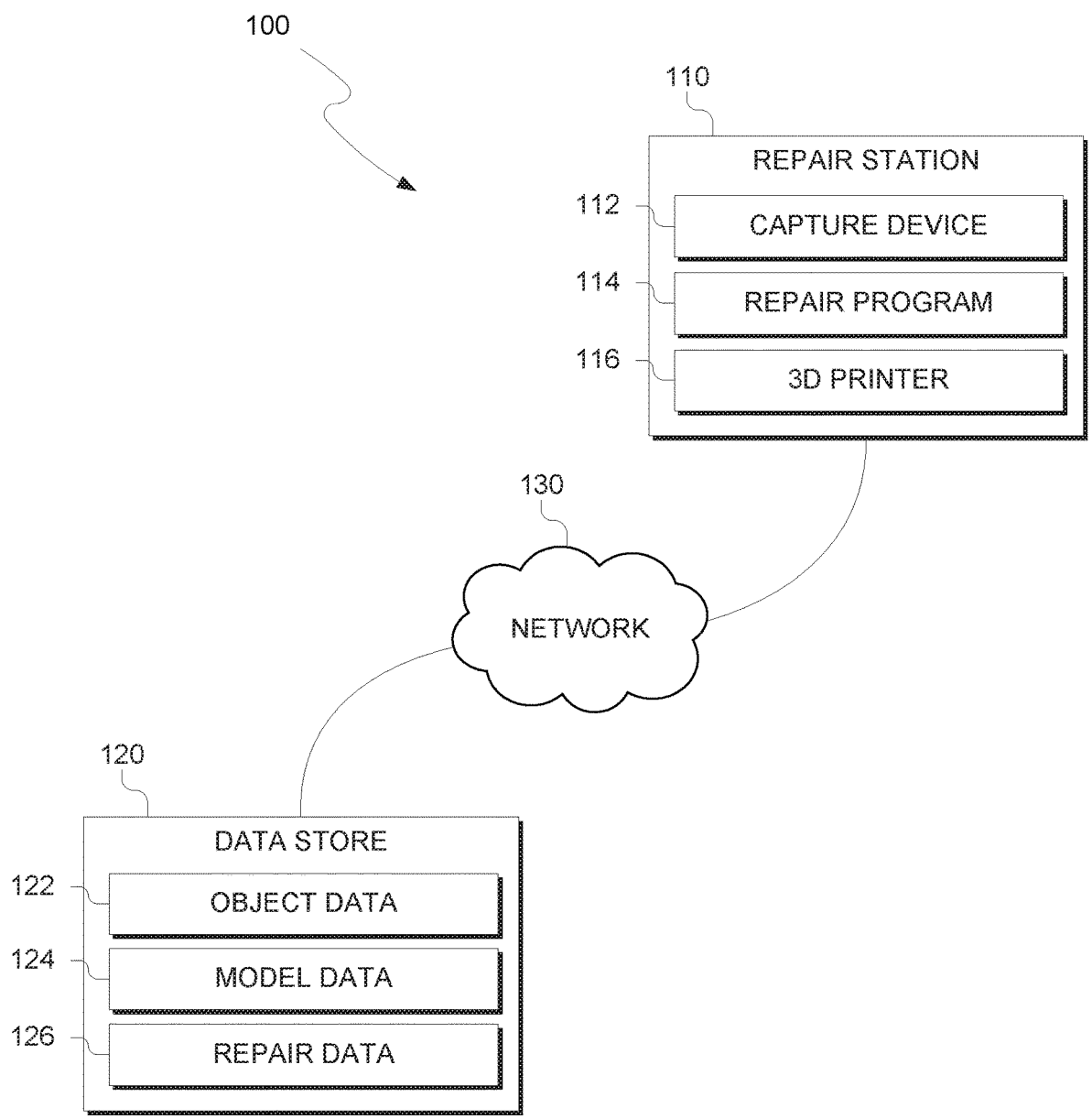
FIG. 1 is a functional block diagram illustrating an object repair environment in accordance with an exemplary embodiment of the present invention.

Three-dimensional (3D) printers have rapidly expanded into markets never considered in the manufacturing field. Hobbyists and average consumers have found the benefits of creating objects on-demand via a 3D printer. However, this proliferation of new manufacturing techniques has expanded to less experienced users, and has introduced needs to both simplify the 3D printing process and provide materials to aid the user in using a 3D printer. While solutions to create objects from a three-dimensional model are known, they assume a certain level of experience and knowledge with 3D printers.

Embodiments of the present invention recognize that by offering tools and materials to create objects with a 3D printer, a user can quickly create an object without repeated attempts to create the precise object they envisioned. Specifically, embodiments of the present invention provide techniques to aid a user in repairing a broken object. By allowing the user to automatically create a model of the broken object using a capture device, such as a camera, the complexities of computer aided drafting and modeling are simplified. Furthermore, by displaying the replacement part as an overlay on top of the broken object, the user is able to visually inspect the replacement part and make any edits to reduce repeated attempts. By providing a set of augmented reality (AR) glasses, the user is able to view the broken object with the replacement part overlayed onto the broken object via the lenses of the AR glasses. By use of sensors and a camera of the AR glasses, as a wearer moves in relation to the broken object, the overlay of the replacement part moves in a corresponding manner.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The present invention will now be described in detail with reference to the Figures. FIG. 1 is a functional block diagram illustrating object repair environment, generally designated 100, in accordance with one embodiment of the present invention. Object repair environment 100 includes repair station 110 and data store 120 connected over network 130. Repair station includes capture device 112, repair program 114 and 3D printer 116. Data store 120 includes object data 122, model data 124 and repair data 126.

In various embodiments of the present invention, repair station 110 and data store 120 are each a computing device that can be a standalone device, a server, a laptop computer, a tablet computer, a netbook computer, a personal computer (PC), or a desktop computer. In another embodiment, repair station 110 and data store 120 each represent a computing system utilizing clustered computers and components to act as a single pool of seamless resources. In general, repair station 110 and data store 120 can each be any computing device or a combination of devices with access to object data 122, model data 124 and repair data 126, and is capable of executing or operating capture device 112, repair program 114 or 3D printer 116. Repair station 110 and data store 120 may include internal and external hardware components, as depicted and described in further detail with respect to FIG. 3.

In this exemplary embodiment, repair program 114 is stored on repair station 110. Object data 122, model data 124 and repair data 126 are stored on data store 120. However, in other embodiments, repair program 114, object data 122, model data 124 and repair data 126 may each be stored externally and accessed through a communication network, such as network 130. Network 130 can be, for example, a local area network (LAN), a wide area network (WAN) such as the Internet, or a combination of the two, and may include wired, wireless, fiber optic or any other connection known in the art. In general, network 130 can be any combination of connections and protocols that will support communications between repair station 110 and data store 120, in accordance with a desired embodiment of the present invention.

In various embodiments, repair station 110 includes capture device 112. Capture device 112 collects data describing an object. In some embodiments, capture device 112 collects visual data including images or video of the object. For example, capture device 112 includes a camera to collect images of the object. In other embodiments, capture device 112 collects other data describing an object such as size and shape of the object. For example, capture device 112 includes a laser scanner to collect size and shape information of the object. The laser scanner provides one or more data points in a three-dimensional space (e.g., x, y and z coordinates) of points where the laser scanner has reflected on the surface of the object. In further embodiments, capture device 112 collects visual data, size and shape data, and other relevant data to represent the object as a three-dimensional model. For example, capture device 112 includes a platform capable of rotating the object while a camera captures video of the object during the rotation. Capture device 112 associates a rotational angle of the platform to frames of the captured video for later creation of a three-dimensional model of the object.

In an embodiment, repair program 114 receives an indication of the position of the object when a captured image is taken by capture device 112. For example, the user provides the orientation of the object when the image is captured (e.g., front, back, left side, right side, bottom or top). In another embodiment, repair program 114 gathers positional information of capture device 112 when an image is captured. For example, capture device 112 includes, with the captured image, the position (e.g., rotational angle) of a rotating platform when the image is captured. As another example, capture device 114 is a handheld device and gathers positional information of the capture device 114 when an image or frames of a video are captured, where the change in position between image or frame captures is included with the captures. One of ordinary skill in the art will appreciate that, in other embodiments, other capture devices and/or methods of capturing information to generate a three-dimensional model of an object are used to capture data points or features of the object placed in capture device 112. In various embodiments, capture device 112 collects data describing the object, such as the size and shape, colors, surface textures, and/or densities of the object or portions of the object. Capture device 112 stores the collected data in object data 122.

In various embodiments, object data 122 includes data collected by capture device 112 for broken objects. In some embodiments, object data 122 includes data collected by capture device 112 for intact objects. Object data 112 includes images, video or other data points gathered by capture device 112. In other embodiments, object data 122 includes data from other sources describing objects. For example, object data 122 includes one or more of the following: (i) images, video or data points of an object taken from sources other than capture device 112, (ii) technical drawings or blueprints of the object, or (iii) product manuals or descriptions of the object. In some embodiments, a user of repair program 114 uploads or directs repair program 114 to download data describing an object to object data 122.

In various embodiments, repair program 114 receives a request from a user to create a replacement part for a broken object. In some embodiments, the user uses capture device 112 to collect data describing the broken object, such as images or video. Repair program 114 stores the collected data from capture device 112 in object data 122. In other embodiments, the user uploads data object data from other sources to object data 122. For example, a user captures images or video of the broken object with a separate device (not shown) and uploads the images using repair program 114.

In various embodiments, repair program 114 generates a model of an object based on information stored in object data 122. In some embodiments, object data 122 includes images and/or video of the object. Repair program 114 analyzes the images and/or video of the object to generate a model of the object. For example, repair program 114 determines features of the object by performing image processing, such as feature extraction or pattern recognition, to image or video gathered by capture device 112. Repair program 114 determines one or more distances the features move between image captures or frames of video to create data points. Repair program 114 collects the data point and uses the data point to create a three-dimensional model of the object. In other embodiments, repair program 114 generates a model based on data points captured by capture device 112. For example, capture device 112 includes a laser scanner and generates data points based on the time-of-flight a laser beam travels from the capture device, reflects on the object and is received by the laser scanner. Repair program 114 uses the differences in the time-of-flight for each beam to generate a set of data points. Repair program 114 generates a three-dimensional model based on the determined data points. In an embodiment, repair program 114 also includes information describing an object other than the size and shape of the object with the model. For example, repair program 114 stores color and texture information of the object in the model. In various embodiments, repair program 114 stores the generated model in model data 124. For example, repair program creates a model using a computer aided drafting (CAD) file or Stereolithography (STL) file format. In some embodiments, repair program 114 receives input from a user to upload a model to model data 124.

In various embodiments, model data 124 includes three-dimensional models for objects (i.e., broken object and intact objects). In some embodiments, model data 124 includes models represented as polygonal meshes of shapes to represent an object. Polygonal meshes include a plurality of flat surfaces (i.e. meshes) with at least three edges. The meshes are orientated to approximate the surface features of the object. In other embodiments, model data 124 includes models represented by a plurality of data points. Each data point has a positional value (e.g., x-value, y-value and z-value) relative to the surface of the object. One of ordinary skill in the art will appreciate that, in other embodiments, other modeling techniques and/or methods of representing an object as a three-dimensional model of an object are used to perform calculation and comparisons (e.g., differences between a broken object model and an intact object model). In an embodiment, repair program 114 converts a three-dimensional model stored in to a format compatible with comparison with another model stored in a different format. For example, an intact object model is stored using a data point and the broken object model is stored using a mesh model. Repair program 114 converts one model (e.g., the data point model) to a format of the other model (e.g., the mesh model).

In various embodiments, repair program 114 determines the differences between the broken object model and the intact object model. Based on the comparison, repair program 114 determines the missing potion of the broken object model by comparing surfaces of the models. For example, repair program 114 determines the missing potion of the broken object model by performing a Boolean model operation between the intact object model and the broken object model. Repair program 114 aligns the broken and intact object model on top of one another. Repair program 114 performs a Boolean difference operation to determine the portion of the intact object model not present in the broken object model. The resulting model is used to create the replacement part model. As another example, when comparing mesh models, repair program 114 compares one or more points on a mesh of the broken object model to one or more points on a mesh of the intact object model. Repair program 114 calculates an average distance between the meshes based on the sampling of the points and the calculated distances between the points. Repair program 114 determines the closest mesh of the intact object model for a given mesh of the broken object model. When the distance is above a certain threshold, the corresponding mesh of the broken object model is determined to be missing from the broken object. After performing the comparison for each mesh of the broken object model, repair program 114 determines the surfaces missing from the broken object model when compared to the intact object model. Based on the missing surfaces, repair program 114 generates a replacement part model for a part to repair the broken portion of the broken object.

In various embodiments, repair program 114 displays a visualization of the replacement part model. In some embodiments, repair program 114 displays the replacement part model via a monitor, such as display 320. Repair program 114 displays the replacement part model along with the broken object model to visualize how the replacement part model will fit into the broken object model. Via repair program 114, a user can manipulate (e.g., rotate, zoom or pan) the view of the models. In an embodiment, repair program 114 renders a color and texture for the replacement part to visualize the look of the replacement part when created. In another embodiment, repair program 114 renders the replacement part over image data of the broken object captured by capture device 112.

In other embodiments, repair program 114 displays the replacement part model via augmented reality glasses (not shown), or AR glasses. AR glasses include a display which projects a visualization unto one or more lenses of the AR glasses. A user of the AR glasses is capable of viewing real world object in conjunction with the projection. Repair program 114 renders a view of the replacement part model to display on the AR glasses. A user wears the AR glasses and places the broken object within the user's view. In some embodiments, AR glasses include a camera which gather's images or video of the broken object. AR glasses sends the images or video to repair program 114. Repair program 114 determines the position of the broken object relative to the user's perspective when viewing the broken object. Repair program 114 generates a model from the received images of the AR glasses. Repair program 114 compares the model to the broken object model and determines the viewing angle the user of the AR glasses is looking at when viewing the broken object. Repair program 114 manipulates the broken object model (e.g., rotating, zooming or panning) based on the determine view and displays the model to reflect the perspective the AR glasses are to the broken object. Using the AR glasses, a user is able to visually inspect the replacement part model in addition with the broken object. By doing so, a user can determine if the replacement part model is correct, and if not, make any edits to the replacement part model.

In various embodiments, repair program 114 receives edits from user and updates the replacement part based on the edits. In an embodiment, edits received from the user include size and shape edits to the replacement part model. For example, a user notices that the replacement part model fits the broken object loosely when viewing the visualization. The user edits the model's surface to create a tighter fit by stretching the model to the desired fit. As another edit for size and shape, a user alters the threshold distance used when comparing models to determine a difference between the broken object model and the intact object model. When viewing the replacement part model, a user notices the fit of the replacement part model is too tight. The user raises the threshold distance causing more meshes from the intact model to be excluded when generating the replacement model part, thereby loosening the fit. In another embodiment, edits received from the user include color of the replacement part model. Repair program 114 determines a color for the replacement part model based an image and/or video data stored in object data 112 of the intact object for the portion determined to be missing from the broken object. A user selects a new color for the replacement part. Repair program 114 changes the visualization of the replacement part model to reflect the new color choice. In an embodiment, received from the user include texture of the replacement part model. In some cases, surface textures may be too small for repair program 114 to determine in the broken and intact object models. A user selects a surface texture (e.g., a surface finish or knurl) and accompanying measurements (e.g., pattern or average surface roughness) to be applied to the replacement part model. Repair program 114 saves the surface texture information and applies the surface texture when creating the replacement part. In various embodiments, repair program 114 receives confirmation that edits are finalized and to proceed with creation of the replacement part based on the replacement part model.

In various embodiments, repair station 110 includes 3D printer 116. 3D printer 116 creates a replacement part based on the replacement part model. 3D printer uses additive manufacturing techniques to create a three-dimensional object. For example, 3D printer creates objects using an extruder. 3D printer 116 heats a material, such as a plastic, to a liquid state and is fed into the extruder. 3D printer 116 moves the nozzle of the extruder to apply the material to a platform to create a three-dimensional object. Repair program 114 sends instruction to 3D printer 116 to move the nozzle, in a coordinate system, to create an object of the same size and shape as the replacement object model. One of ordinary skill in the art will appreciate that, in other embodiments, other 3D printing apparatuses and/or methods of creating a three-dimensional object based on a three-dimensional model are used to create a replacement part to repair the broken object. In an embodiment, repair program 114 instructs 3D printer 116 to use a selected material to produce a replacement part represented by the replacement part model. For example, if the replacement part model requires a certain color of the replacement part, then repair program 114 sends an instruction to 3D printer to use a material representative of the color. In another embodiment, repair program 114 displays instructions for the user to perform prior to creation of the replacement part. For example, repair program 114 instructs the user to insert a certain material into 3D printer 116 to produce a certain density or weight for the replacement part. In some embodiments, repair program 114 converts the replacement part model to a format used by 3D printer 116. For example, in an extrusion based 3D printer, the printing process starts from the bottom potion of the model and adding material in a vertical manner to the base. Repair program 114 converts the replacement part model such that 3D Printer 116 creates the replacement part as visualized and reviewed by the user.

In various embodiments, repair program 114 displays information to aid in the repair of the broken object once the replacement part is created. Repair data 126 includes instructions and tips to the user to ensure proper repair of the broken object with the replacement part created by 3D printer 116. For example, repair data 126 includes adhesives which are preferred to attach the replacement part to the material of the broken object. As another example, repair data 126 includes product manuals and assembly instruction of the broken object to give the user instructions to access part of the broken object or dismantle the broken object. As another example, repair data 126 includes paint suggestions to replicate the color of the replacement part model in cases where an additive material to match the color is not available.

Figure 2:
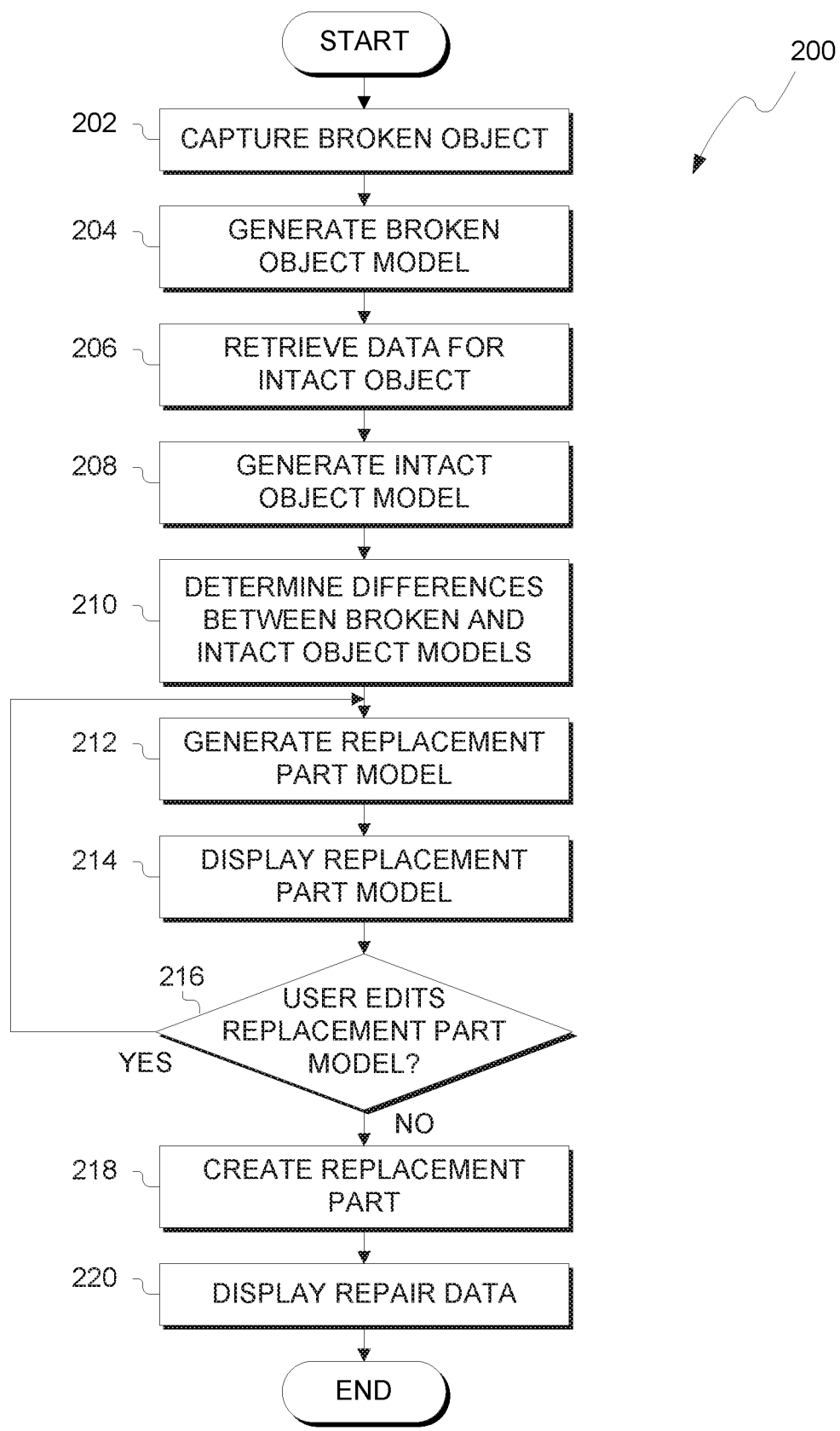
FIG. 2 illustrates operational processes of a repair program, on a computing device within the environment of FIG. 1, in accordance with an exemplary embodiment of the present invention.

FIG. 2 is a flowchart illustrating operational processes, generally designated 200, of repair program 114 for creating a replacement part for a broken object, on a computing device within the environment of FIG. 1, in accordance with an exemplary embodiment of the present invention.

In process 202, repair program 114 captures information describing a broken object. In some embodiments, repair program 114 retrieves visual information, such as images or video, from capture device 112 describing the size, shape, colors and/or textures of the broken object. In an embodiment, repair program 114 retrieves structural information describing the broken object (e.g., data points gathered from a laser scanner), describing the size, shape, textures and/or densities of the broken object. In other embodiments, repair program 114 retrieves visual or structural information from a storage device, such as data store 120, or other device or location on network 130. In some embodiments, repair program 114 retrieves positional information of the visual or structural information retrieved to aid in generation of a model of the broken object. For example, repair program 114 retrieves the position of capture device 112 when a given piece of visual or structural information was captured in relation to the broken object. In other embodiments, repair program 114 receives input from a user describing the position of the broken object when visual or structural information was captured (e.g., top view or side view, distance and/or angle of capture device 112).

In process 204, repair program 114 generates a model of the broken object based on the retrieved information. In embodiments where visual information describing the broken object (e.g., images or video) is retrieved, repair program 114 performs image processing, such as feature extraction, to determine points or features in the visual information of the broken object. Repair program 114 extrapolates changes in distances within the visual information of the points or features to determine the size and shape of the broken object. In embodiments where structural information is captured, repair program 114 converts the information to a format used for the broken object model (e.g., a CAD file or a STL file). In other embodiments, repair program 114 determines the color(s) of the broken object and stores the determined color(s) in the broken object model. In some embodiments, repair program 114 retrieves structural information to determine the density of the object and includes the density information in the broken object model.

In process 206, repair program 114 retrieves data describing an intact object. In some embodiments, repair program 114 retrieves visual and/or structural information from capture device 112 of an intact object. In other embodiments, repair program 114 retrieves visual and/or structural information describing the intact object from a storage device, such as data store 120, or a location on network 130. In an embodiment, repair program 114 retrieves reference materials (e.g., product/user manuals or technical drawings) describing the intact object's size, shape, color(s), textures and/or densities of the broken object.

In process 208, repair program 114 generates a model of the intact object. In embodiments where visual information describing the broken object (e.g., images or video) is retrieved, repair program 114 performs image processing, such as feature extraction, to determine points or features in the visual information of the broken object. In embodiments where structural information is captured, repair program 114 converts the information to a format used for the broken object model (e.g., a CAD file or a STL file). In some embodiments, repair program 114 receives input from a user to retrieve a predetermined model for a storage device, such as data store 120, or a location on network 130.

In process 210, repair program 114 determines the differences between the broken object model and the intact object model. For example, repair program 114 aligns the broken and intact object models by matching features present in both models. Repair program 114 performs a Boolean difference operation between the broken and intact object models to determine the portion of the intact object model missing from the broken object model. In process 212, repair program 114 generates a model for the missing portion of the broken object model as a replacement part model, based on the comparison determined in process 210.

In process 214, repair program 114 displays a render of the replacement part model. In some embodiments, repair program 114 displays the replacement part model on top of the broken object model. For example, repair program 114 renders the broken object model and overlays the replacement part model on top of the broken object model. As another example, repair program 114 displays an image used to generate the broken object model. Repair program 114 retrieves positional information related to the image and determines a viewing perspective. Based on the determined perspective, repair program 114 renders the replacement part model such that it fits onto the portion of the image where the replacement part to be created will be placed. In other embodiments, repair program 114 displays the replacement part model via AR glasses while a user views the broken object. AR glasses include a display that projects the replacement part model onto one or more lenses of the AR glasses. Repair program 114 receives visual information from AR glasses via a camera that is part of the AR glasses. A user of the AR glasses is capable of viewing the broken object in conjunction with a projection of the replacement part model. Repair program 114 receives images from the camera to determine the viewing perspective of the user wearing the AR glasses. Based on the viewing perspective, repair program 114 generates a model of the replacement part model and sends the image for display on the AR glasses. The AR glasses display the image onto one or more lenses of the AR glasses such that the displayed replacement part model overlay the real world broken object when viewed through the lenses.

In process 216, repair program 114 receives edits from a user to make to the replacement part model. The user reviews the replacement part model displayed in process 214 and decides if any edits are required for the replacement part model. If the user makes any edits ("yes" branch of process 216), then repair program 114 generates a new replacement part model (process 212) and displays the updated replacement part model to the user (process 214). For example, the user makes edits to the size or shape of the object, the surface texture of the object, or the color of the object. If the user has no edits to make to the replacement part model ("no" branch of process 216), then repair program 114 sends instructions to 3D printer 116 to create the replacement part based on the replacement part model.

In process 218, 3D printer 116 creates a replacement part based on instruction and the replacement part model received from repair program 114. Based on the model and/or type of printer, repair program 114 determines the instructions to send to 3D printer to create the replacement part. In some embodiments, repair program 114 sends the replacement part model in a format native to 3D printer 116. 3D printer 116 interprets the replacement part model and creates the replacement part. In process 220, repair program 114 displays repair data to aid in the repair of the broken object. For example, repair program suggests adhesives to affix the replacement part to the broken object, cooling times for the replacement part, and paint or finish suggestions. Repair program 114 also displays any links or direct downloads of product or user manuals related to the broken object, relevant repair videos or walkthroughs, or references images of intact versions of the broken object.

Figure 3:
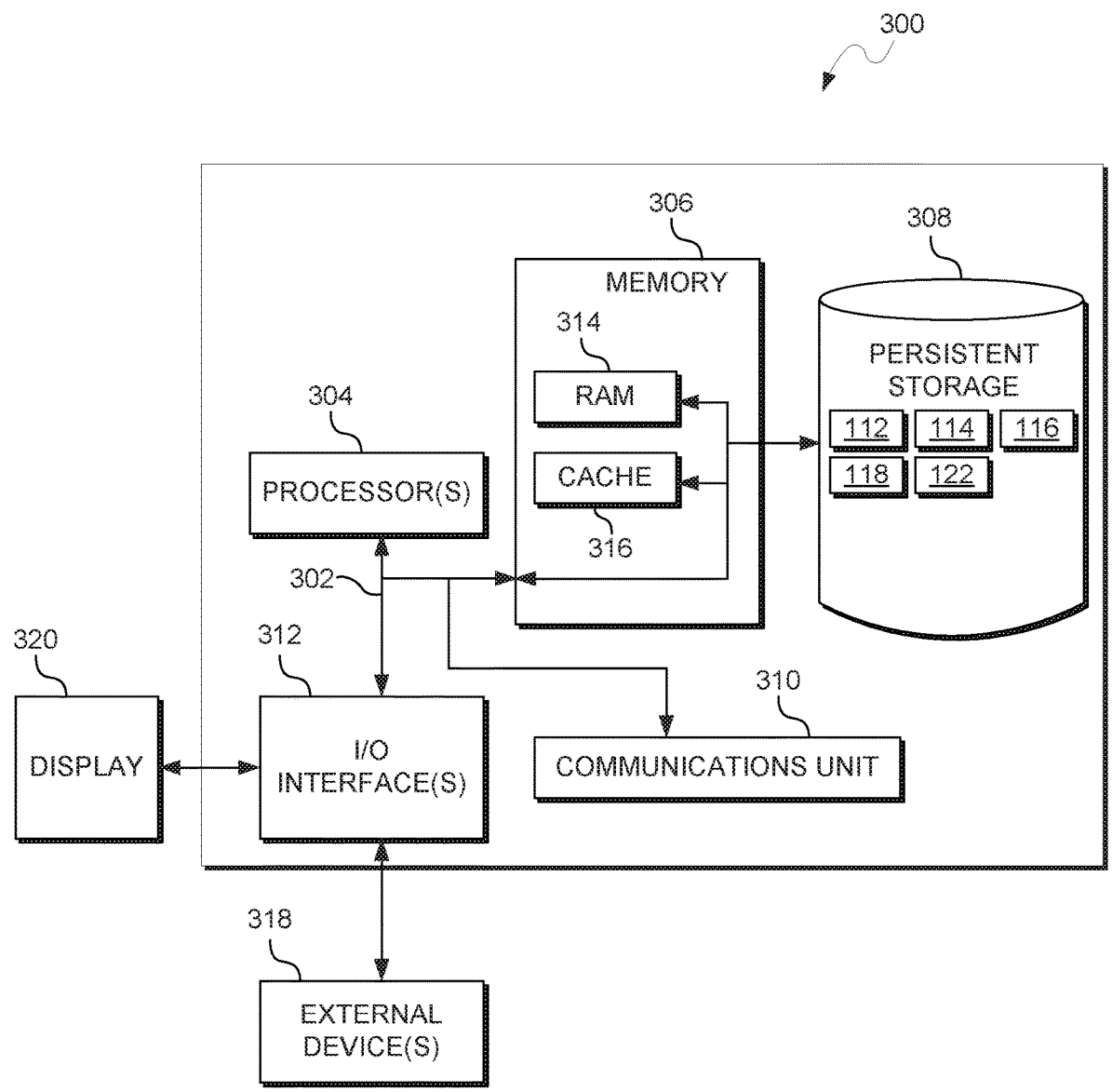
FIG. 3 depicts a block diagram of components of the computing device executing the operation processes of FIG. 2, in accordance with an exemplary embodiment of the present invention.

FIG. 3 depicts a block diagram, 300, of components of each of repair station 110 and data store 120, in accordance with an illustrative embodiment of the present invention. It should be appreciated that FIG. 3 provides only an illustration of one implementation and does not imply any limitations with regard to the environments in which different embodiments may be implemented. Many modifications to the depicted environment may be made.

Repair station 110 and data store 120 each include communications fabric 302, which provides communications between computer processor(s) 304, memory 306, persistent storage 308, communications unit 310, and input/output (I/O) interface(s) 312. Communications fabric 302 can be implemented with any architecture designed for passing data and/or control information between processors (such as microprocessors, communications and network processors, etc.), system memory, peripheral devices, and any other hardware components within a system. For example, communications fabric 302 can be implemented with one or more buses.

Memory 306 and persistent storage 308 are computer-readable storage media. In this embodiment, memory 306 includes random access memory (RAM) 314 and cache memory 316. In general, memory 306 can include any suitable volatile or non-volatile computer-readable storage media.

Repair program 114, object data 122, model data 124 and repair data 126 are each stored in persistent storage 308 for execution and/or access by one or more of the respective computer processors 304 via one or more memories of memory 306. In this embodiment, persistent storage 308 includes a magnetic hard disk drive. Alternatively, or in addition to a magnetic hard disk drive, persistent storage 308 can include a solid state hard drive, a semiconductor storage device, read-only memory (ROM), erasable programmable read-only memory (EPROM), flash memory, or any other computer-readable storage media that is capable of storing program instructions or digital information.

The media used by persistent storage 308 may also be removable. For example, a removable hard drive may be used for persistent storage 308. Other examples include optical and magnetic disks, thumb drives, and smart cards that are inserted into a drive for transfer onto another computer-readable storage medium that is also part of persistent storage 308.

Communications unit 310, in these examples, provides for communications with other data processing systems or devices, including resources of network 130. In these examples, communications unit 310 includes one or more network interface cards. Communications unit 310 may provide communications through the use of either or both physical and wireless communications links. Repair program 114, object data 122, model data 124 and repair data 126 may each be downloaded to persistent storage 308 through communications unit 310.

I/O interface(s) 312 allows for input and output of data with other devices that may be connected to each of repair station 110 and data store 120. For example, I/O interface 312 may provide a connection to external devices 318 such as a keyboard, keypad, a touch screen, and/or some other suitable input device. External devices 318 can also include portable computer-readable storage media such as, for example, thumb drives, portable optical or magnetic disks, and memory cards. Software and data used to practice embodiments of the present invention, e.g., repair program 114, object data 122, model data 124 and repair data 126, can be stored on such portable computer-readable storage media and can be loaded onto persistent storage 308 via I/O interface(s) 312. I/O interface(s) 312 also connects to display 320.

Display 320 provides a mechanism to display data to a user and may be, for example, a computer monitor, or a television screen.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

It is to be noted that the term(s) "Smalltalk" and the like may be subject to trademark rights in various jurisdictions throughout the world and are used here only in reference to the products or services properly denominated by the marks to the extent that such trademark rights may exist.

What is claimed is:

1. A method of repairing a broken object, the method comprising:
    retrieving, by one or more processors, data describing the broken object;
    retrieving, by the one or more processors, data describing an intact object, wherein the intact object includes a part missing from the broken object;
    generating, by the one or more processors, a first three-dimensional model of the broken object based, at least in part, on the data description of the broken object;
    generating, by the one or more processors, a second three-dimensional model of the intact object based, at least in part, on the data description of the intact object;
    generating, by the one or more processors, a third three-dimensional model based, at least in part, on a difference between the first three-dimensional model and the second three-dimensional model when there is a determined difference; and
    sending, by the one or more processors, one or more instructions to a three-dimensional printer to create an object based, at least in part, on the third three-dimensional model when the determined difference is present, wherein the three-dimensional printer creates the object based, at least in part, on the third three-dimensional model.

2. The method of claim 1, the method further comprising:
    displaying, by the one or more processors, the third three-dimensional model and the first three-dimensional model, wherein the third three-dimensional model is displayed in a location of the part missing from the broken object relative to the first three-dimensional model.

3. The method of claim 1, the method further comprising:
    determining, by the one or more processors, a viewing perspective of a user wearing a set of augmented reality glasses, wherein the user is viewing the broken object; and
    displaying, by the one or more processors, the third three-dimensional model on the set of augmented reality glasses, wherein a position of the displayed third three-dimensional model is determined based, at least in part, on the viewing perspective of the user.

4. The method of claim 3, the method further comprising:
    receiving, by the one or more processors, one or more changes to the third three-dimensional model, wherein the one or more changes include one or more of the following: (i) size and shape; (ii) color; (iii) texture; or (iv) density;
    updating, by the one or more processors, the third three-dimensional model; and
    displaying, by the one or more processors, the updated third three-dimensional model on the set of augmented reality glasses.

5. The method of claim 1, wherein the data description of the broken object further comprises information describing the size and shape of the broken object, wherein the information comprises a plurality of images of the broken object.

6. The method of claim 5, wherein the step of generating a first three-dimensional model is based, at least in part, on determining a first feature in the plurality of images of the broken object and a change in distance of the first feature between at least two of the images of the broken object.

7. The method of claim 1, wherein the data description of the broken object further comprises information describing the size and shape of the broken object, wherein the information comprises a plurality of data points gathered by a laser scanner.

8. A computer program product for repairing a broken object, the computer program product comprising:
    one or more computer-readable storage media and program instructions stored on the one or more computer-readable storage media, the program instructions comprising:
        program instructions executed to retrieve data describing the broken object;
        program instructions executed to retrieve data describing an intact object, wherein the intact object includes a part missing from the broken object;
        program instructions executed to generate a first three-dimensional model of the broken object based, at least in part, on the data description of the broken object;
        program instructions executed to generate a second three-dimensional model of the intact object based, at least in part, on the data description of the intact object;
        program instructions executed to generate a third three-dimensional model based, at least in part, on a difference between the first three-dimensional model and the second three-dimensional model when there is a determined difference; and
    program instructions executed to send one or more instructions to a three-dimensional printer to create an object based, at least in part, on the third three-dimensional model when the determined difference is present, wherein the three-dimensional printer creates the object based, at least in part, on the third three-dimensional model.

9. The computer program product of claim 8, the program instructions further comprising:
    program instructions executed to display the third three-dimensional model and the first three-dimensional model, wherein the third three-dimensional model is displayed in a location of the part missing from the broken object relative to the first three-dimensional model.

10. The computer program product of claim 8, the program instructions further comprising:
    program instructions executed to determine a viewing perspective of a user wearing a set of augmented reality glasses, wherein the user is viewing the broken object; and
    program instructions executed to display the third three-dimensional model on the set of augmented reality glasses, wherein a position of the displayed third three-dimensional model is determined based, at least in part, on the viewing perspective of the user.

11. The computer program product of claim 10, the program instructions further comprising:
    program instructions executed to receive one or more changes to the third three-dimensional model, wherein the one or more changes include one or more of the following: (i) size and shape; (ii) color; (iii) texture; or (iv) density;
    program instructions executed to update the third three-dimensional model; and
    program instructions executed to display the updated third three-dimensional model on the set of augmented reality glasses.

12. The computer program product of claim 8, wherein the data description of the broken object further comprises information describing the size and shape of the broken object, wherein the information comprises a plurality of images of the broken object.

13. The computer program product of claim 12, wherein the step of generating a first three-dimensional model is based, at least in part, on determining a first feature in the plurality of images of the broken object and a change in distance of the first feature between at least two of the images of the broken object.

14. The computer program product of claim 8, wherein the data description of the broken object further comprises information describing the size and shape of the broken object, wherein the information comprises a plurality of data points gathered by a laser scanner.

15. A computer system for repairing a broken object, the computer system comprising:
    one or more computer processors;
    one or more computer readable storage media; and
    program instructions stored on the computer readable storage media for execution by at least one of the one or more processors, the program instructions comprising:
        program instructions executed to retrieve data describing the broken object;
        program instructions executed to retrieve data describing an intact object, wherein the intact object includes a part missing from the broken object;
        program instructions executed to generate a first three-dimensional model of the broken object based, at least in part, on the data description of the broken object;

program instructions executed to generate a second three-dimensional model of the intact object based, at least in part, on the data description of the intact object;

program instructions executed to generate a third three-dimensional model based, at least in part, on a difference between the first three-dimensional model and the second three-dimensional model when there is a determined difference; and program instructions executed to send one or more instructions to a three-dimensional printer to create an object based, at least in part, on the third three-dimensional model when the determined difference is present, wherein the three-dimensional printer creates the object based, at least in part, on the third three-dimensional model.

16. The computer system of claim 15, the program instructions further comprising:

program instructions executed to display the third three-dimensional model and the first three-dimensional model, wherein the third three-dimensional model is displayed in a location of the part missing from the broken object relative to the first three-dimensional model.

17. The computer system of claim 15, the program instructions further comprising:

program instructions executed to determine a viewing perspective of a user wearing a set of augmented reality glasses, wherein the user is viewing the broken object; and program instructions executed to display the third three-dimensional model on the set of augmented reality glasses, wherein a position of the displayed third three-dimensional model is determined based, at least in part, on the viewing perspective of the user.

18. The computer system of claim 17, the program instructions further comprising:

program instructions executed to receive one or more changes to the third three-dimensional model, wherein the one or more changes include one or more of the following: (i) size and shape; (ii) color; (iii) texture; or (iv) density;

program instructions executed to update the third three-dimensional model; and program instructions executed to display the updated third three-dimensional model on the set of augmented reality glasses.

19. The computer system of claim 15, wherein the data description of the broken object further comprises information describing the size and shape of the broken object, wherein the information comprises a plurality of images of the broken object.

20. The computer system of claim 19, wherein the step of generating a first three-dimensional model is based, at least in part, on determining a first feature in the plurality of images of the broken object and a change in distance of the first feature between at least two of the images of the broken object.

* * * * *